(12) United States Patent
Salling et al.

(10) Patent No.: US 7,199,413 B2
(45) Date of Patent: Apr. 3, 2007

(54) JUNCTION-ISOLATED DEPLETION MODE FERROELECTRIC MEMORY DEVICES AND SYSTEMS

(75) Inventors: Craig T. Salling, Plano, TX (US); Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/098,747

(22) Filed: Apr. 4, 2005

(65) Prior Publication Data

US 2005/0179070 A1    Aug. 18, 2005

Related U.S. Application Data

(62) Division of application No. 10/926,470, filed on Aug. 26, 2004, now Pat. No. 6,982,449, which is a division of application No. 10/306,592, filed on Nov. 27, 2002, now Pat. No. 6,876,022, which is a division of application No. 09/652,557, filed on Aug. 31, 2000, now Pat. No. 6,515,889.

(51) Int. Cl.
    *H01L 29/76* (2006.01)
(52) U.S. Cl. .................. 257/295; 257/296; 257/421
(58) Field of Classification Search .............. 257/295, 257/296, 421
    See application file for complete search history.

(56) References Cited

U.S. PATENT DOCUMENTS

| | | | |
|---|---|---|---|
| 4,888,630 A | 12/1989 | Paterson |
| 5,119,329 A | 6/1992 | Evans, Jr. et al. |
| 5,146,299 A | 9/1992 | Lampe et al. |
| 5,273,927 A | 12/1993 | Gnadinger |
| 5,289,410 A | 2/1994 | Katti et al. |
| 5,345,414 A | 9/1994 | Nakamura |
| 5,361,225 A | 11/1994 | Ozawa |
| 5,615,144 A | 3/1997 | Kimura et al. |
| 5,633,821 A | 5/1997 | Nishimura et al. |
| 5,654,568 A | 8/1997 | Nakao |
| 5,680,344 A | 10/1997 | Seyyedy |
| 5,715,196 A | 2/1998 | Odake et al. |
| 5,812,442 A | 9/1998 | Yoo |
| 5,847,989 A | 12/1998 | Seyyedy |
| 5,905,672 A | 5/1999 | Seyyedy |
| 5,907,861 A | 5/1999 | Seyyedy |
| 5,909,389 A | 6/1999 | Kawakubo et al. |
| 5,973,911 A | 10/1999 | Nishioka |
| 5,990,507 A | 11/1999 | Mochizuki et al. |
| 5,999,439 A | 12/1999 | Seyyedy |
| 6,026,024 A | 2/2000 | Odani et al. |
| 6,028,784 A | 2/2000 | Mori et al. |

(Continued)

FOREIGN PATENT DOCUMENTS

JP    403101168 A    4/1991

(Continued)

*Primary Examiner*—Doug Menz
(74) *Attorney, Agent, or Firm*—Leffert Jay & Polglaze, PA

(57) ABSTRACT

Depletion-mode ferroelectric transistors are adapted for use as non-volatile memory cells for memory devices and electronic systems. Various embodiments are described having a diode interposed between the bit line and a source/drain region of the transistor for added margin against read disturb.

21 Claims, 11 Drawing Sheets

U.S. PATENT DOCUMENTS

| | | |
|---|---|---|
| 6,031,754 A | 2/2000 | Derbenwick et al. |
| 6,034,882 A | 3/2000 | Johnson et al. |
| 6,049,477 A | 4/2000 | Taira |
| 6,067,244 A | 5/2000 | Ma et al. |
| 6,108,236 A | 8/2000 | Barnett |
| 6,121,072 A | 9/2000 | Choi et al. |
| 6,121,642 A | 9/2000 | Newns |
| 6,144,579 A | 11/2000 | Taira |
| 6,324,101 B1 | 11/2001 | Miyawaki |
| 6,337,805 B1 | 1/2002 | Forbes et al. |
| 6,587,365 B1 | 7/2003 | Salling |

FOREIGN PATENT DOCUMENTS

| | | |
|---|---|---|
| JP | 411040784 A | 2/1999 |
| JP | 2001229685 | 8/2001 |

JUNCTION-ISOLATED DEPLETION MODE FERROELECTRIC MEMORY DEVICES AND SYSTEMS

RELATED APPLICATIONS

This is a divisional application of U.S. patent application Ser. No. 10/926,470 filed Aug. 26, 2004 now U.S. Pat. No. 6,982,449 and titled, JUNCTION-ISOLATED DEPLETION MODE FERROELECTRIC MEMORY DEVICES, which is a divisional application of U.S. patent application Ser. No. 10/306,592, filed Nov. 27, 2002 and issued Apr. 5, 2005 as U.S. Pat. No. 6,876,022, which is a divisional application of U.S. patent application Ser. No. 09/652,557, filed Aug. 31, 2000 and issued Feb. 4, 2003 as U.S. Pat. No. 6,515,889, each of which is commonly assigned, and the entire contents of which are incorporated herein by reference.

This application is further related to U.S. patent application Ser. No. 09/653,074 filed Aug. 31, 2000 and issued Jul. 1, 2003 as U.S. Pat. No. 6,587,365, which is commonly assigned.

TECHNICAL FIELD OF THE INVENTION

The present invention relates to ferroelectric memory devices, and particularly to memory cells and memory array architectures making use of junction-isolated ferroelectric depletion-mode field-effect transistors.

BACKGROUND OF THE INVENTION

Ferroelectric materials are a class of materials that can be thought of as having electrical properties somewhat analogous to the magnetic properties of ferromagnetic materials. A uniaxial ferromagnetic material can be magnetized in one of two directions, and thereafter will retain a magnetic field in that direction even after the applied magnetic field is removed; similarly, a ferroelectric material can be "polarized" in either direction (by applying an electric field to it), and thereafter will retain an electric field in that direction, even after the applied electric field is removed.

Ferroelectric materials have been successfully integrated into integrated circuit processes, but this integration can have some drawbacks. Ferroelectric materials having sufficient thermal stability for integrated circuit processing often include incompatible metals that must be separated from a silicon substrate. Such ferroelectric materials also tend to be strong oxygen sources, increasing the risk of undesirable oxidation of adjacent materials. Additionally, ferroelectric materials generally can only withstand a finite number of polarization reversals before their performance degrades.

Ferroelectric memories exploit the properties of ferroelectric materials. These materials are useful in semiconductor memories as they have characteristics to provide a non-volatile memory function; after a ferroelectric material has been polarized in one direction, it will hold that polarization for an extended time without further power input. In contrast, dynamic random access memory (DRAM) requires periodic refresh to maintain its data value, thus losing its data value upon the removal of its power source.

Since the physics of ferroelectric floating-gate memories are similar to standard floating-gate memories (such as Flash memories), the sensing operation is correspondingly similar. Typically, floating-gate memories are sensed by detecting the activation/deactivation of the selected transistor in response to a given gate/source voltage. Although a typical floating-gate memory's activation/deactivation state is dependent on a stored charge of its floating gate, and a ferroelectric floating-gate memory's activation/deactivation state is dependent on a polarization of a ferroelectric layer, they both can exhibit this binary behavior.

At the microscopic scale, the ferroelectric material can be seen to be divided into domains. A domain is a volume within which the polarization of the material is uniform. Each domain can have only two stable polarization states. The magnitude of the polarization state of the bulk material is a composite of the individual domain polarization states.

FIG. 1 schematically shows a typical hysteresis curve 12 for a ferroelectric material. When the applied electric field E is increased to a positive value $E_1$, the polarization of the material will increase to a value $P_1$. When the applied positive field is subsequently removed, the polarization will fall back to a positive "remanent polarization" value $P_r$. In a similar manner, when the applied electric field is increased in the opposite direction, to a negative value $-E_2$, the polarization of the material will go to a negative value $-P_2$. When the applied negative field is subsequently removed, the polarization will fall back to a negative remanent polarization value $-P_r$. Thus, the material can take either of two polarization states in the absence of an electric field, depending on how it has been affected by the previously applied field. For electrical circuit analysis, the polarization state of a ferroelectric film can be thought of in terms of surface charge density, i.e., as amount of charge per unit area (usually written as "σ"). Curve 14 is an example of a minor hysteresis curve obtained when the same material is cycled between electrical potentials having insufficient magnitude to cause complete reversal of the polarization.

When an increasingly strong electric field is applied to a ferroelectric material, more and more of the domains will change their state to line up with the applied field. The electric field seen by any one domain is affected by the polarization states of the other domains which are nearby. Consequently, a full reversal of polarization requires not only some threshold energy level, but also some delay as individual domains align. This is inconvenient for ferroelectric memories, since it limits the write speed of any such memory. Moreover, in memories that use a destructive read, i.e., a read operation using a voltage sufficient to cause reversal of polarity, this phenomenon is also an important constraint on read access time as the data must be rewritten after sensing. This has been a problem with commercialization of ferroelectric memories, since it is highly desirable for ferroelectric memories to have access times approximately as fast as those for DRAM memories.

For the reasons stated above, and for other reasons stated below that will become apparent to those skilled in the art upon reading and understanding the present specification, there is a need in the art for alternate architecture and methods of operation of ferroelectric semiconductor memory devices.

SUMMARY OF THE INVENTION

The above-mentioned problems with memory devices and other problems are addressed by the present invention and will be understood by reading and studying the following specification.

Depletion-mode ferroelectric transistors are described herein for use as non-volatile memory cells. Such memory cells find use in non-volatile memory devices as well as other electronic systems having non-volatile memory storage. Various embodiments are described having a diode interposed between the bit line and a source/drain region of the transistor for added margin against read disturb, i.e., undesirable reversal of polarity. Various additional embodiments are described having an array architecture such that two memory cells sharing the same bit line also share the same program line. Using this configuration, non-selected cells are readily supplied with gate/source voltages sufficient to maintain the cells in a deactivated state during read and write operations on selected cells while avoiding undesirable reversal of polarity.

For one embodiment, the invention provides a memory device. The memory device includes an array of memory cells, with each memory cell including a ferroelectric layer formed overlying a first well region having a first conductivity type, wherein the first well region is formed in a substrate having a second conductivity type opposite the first conductivity type; a control gate formed overlying the ferroelectric layer; a first source/drain region having the first conductivity type formed in the first well region; a second source/drain region having the first conductivity type formed in the first well region; a channel region having the first conductivity type formed in the first well region and interposed between the first and second source/drain regions; and a second well region having the second conductivity type formed in the first well region and coupled to the second source/drain region, wherein the second well region is isolated from the control gate. The memory device further includes a plurality of word lines coupled to rows of memory cells of the array of memory cells through their control gates, a plurality of program lines coupled to columns of memory cells of the array of memory cells through their first source/drain regions, a plurality of bit lines coupled to columns of memory cells of the array of memory cells through their second well regions, a row decoder coupled to the array of memory cells, and a column decoder coupled to the array of memory cells.

For another embodiment, the invention provides a memory device. The memory device includes an array of memory cells, with each memory cell including a ferroelectric layer formed overlying a first well region having a first conductivity type, wherein the first well region is formed overlying a substrate and wherein a layer of dielectric material is interposed between the first well region and the substrate; a control gate formed overlying the ferroelectric layer; a first source/drain region having the first conductivity type formed in the first well region; a second source/drain region having the first conductivity type formed in the first well region; a channel region having the first conductivity type formed in the first well region and interposed between the first and second source/drain regions; and a second well region having the second conductivity type formed in the first well region and coupled to the second source/drain region, wherein the second well region is isolated from the control gate. The memory device further includes a plurality of word lines coupled to rows of memory cells of the array of memory cells through their control gates, a plurality of program lines coupled to columns of memory cells of the array of memory cells through their first source/drain regions, a plurality of bit lines coupled to columns of memory cells of the array of memory cells through their second well regions, a row decoder coupled to the array of memory cells, and a column decoder coupled to the array of memory cells.

The invention further provides apparatus and systems of various scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Memory cells in accordance with various embodiments of the invention include a ferroelectric (FE) field-effect transistor (FET), such as a metal-ferroelectric-metal-oxide-semiconductor (MFMOS) FET. Each FE FET of the various embodiments has at least one source/drain region having the same conductivity type as its channel. The FE FETs include an FE dielectric material.

The fabrication of the structures of the various example embodiments are demonstrated using silicon MOS technology. Memory cells of the example embodiments are fabricated on a p-type silicon substrate. However, as noted above, other substrates may be used for integrated circuit fabrication. Furthermore, the various embodiments could similarly be fabricated on a substrate having opposite conductivity, using appropriate changes in dopants and applied voltages. Additionally, various components of the memory cells may be fabricated in an order different from the example embodiments while still producing a memory cell in accordance with the invention.

Figure 1:
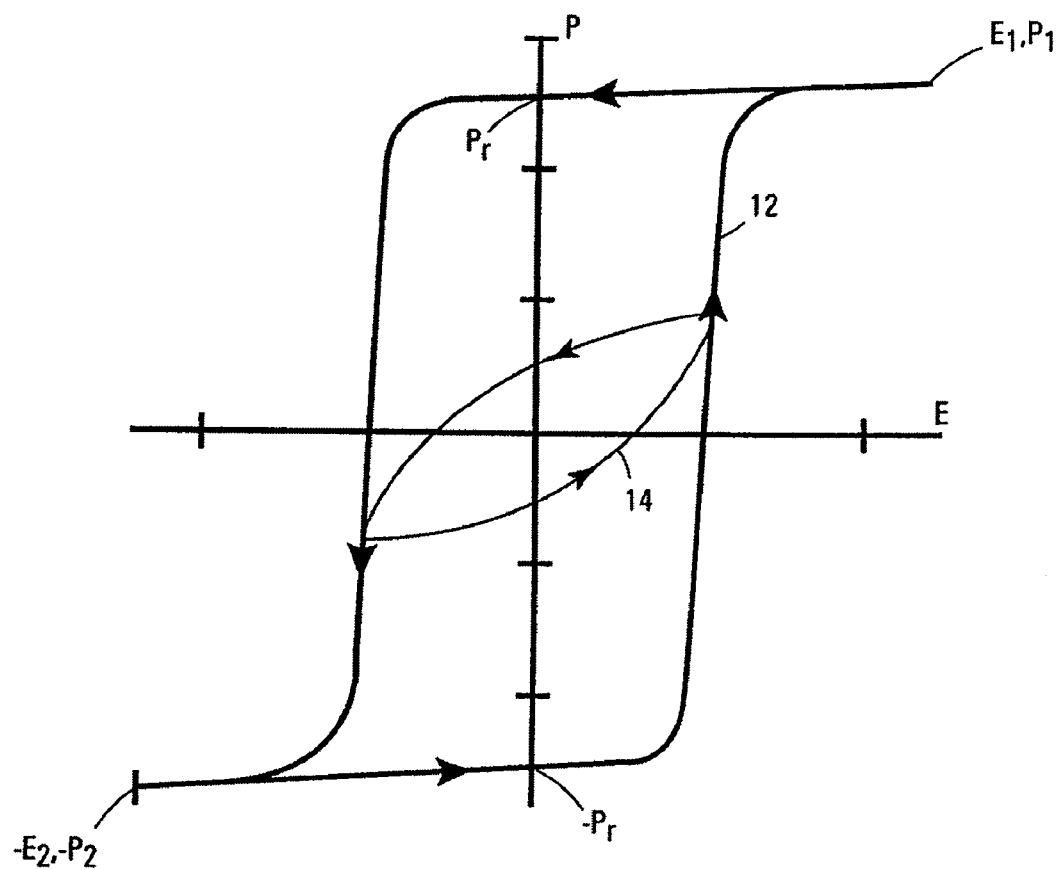
FIG. 1 is a diagram of typical hysteresis curves for a ferroelectric material.
Figure 2:
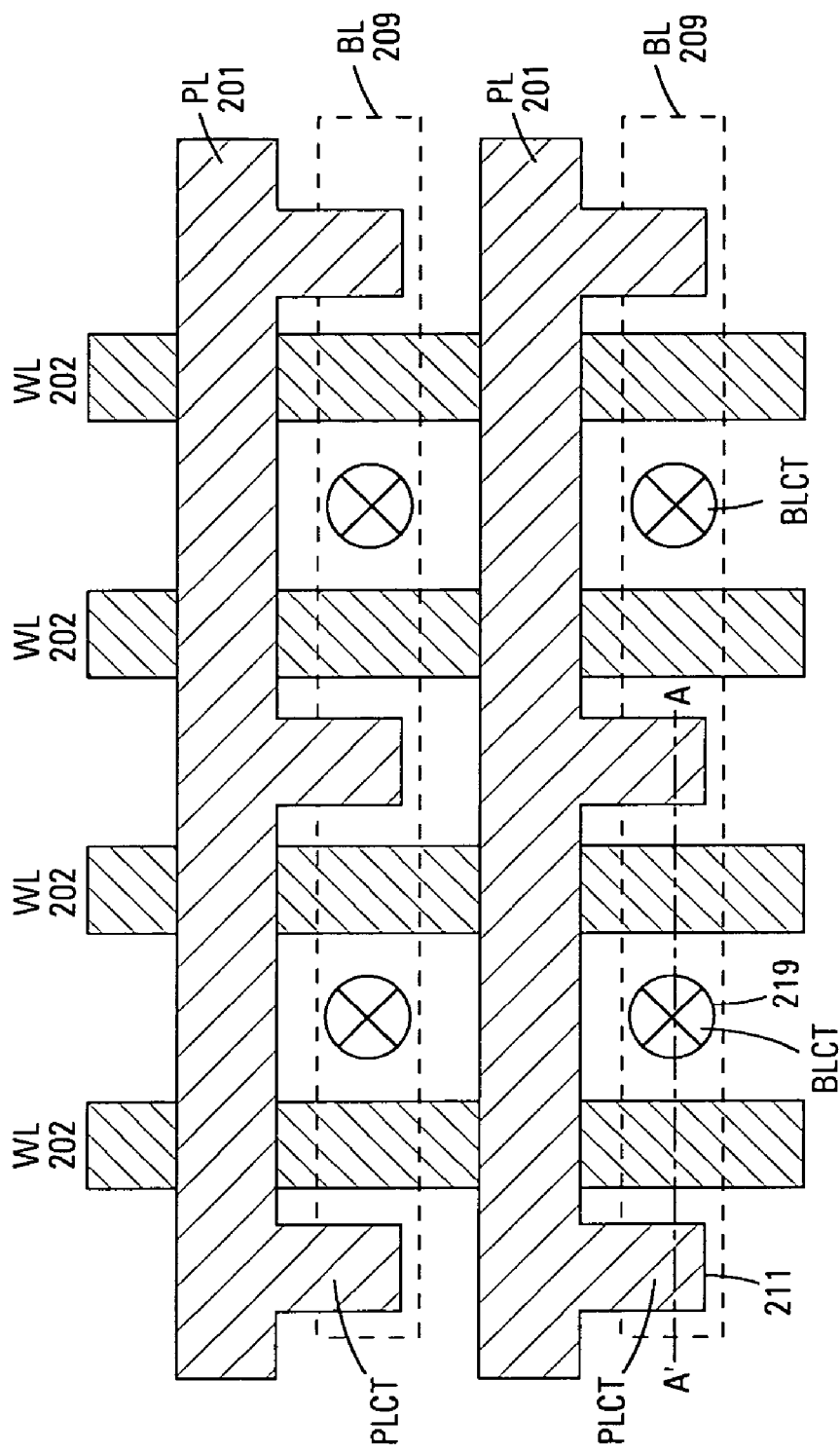
FIG. 2 is a schematic of a portion of a memory device showing an array architecture in accordance with an embodiment of the invention.

FIG. 2 shows a sample layout of a portion of a memory device using the disclosed memory cells. In this drawing, bit lines 209 and program lines 201 are both orthogonal to the word lines 202 which they overlie. Furthermore, two memory cells coupled to the same bit line 209 will also be coupled to the same program line 201. Using this configuration, non-selected cells are readily supplied with gate/source voltages sufficient to maintain the cells in a deactivated state during read and write operations on selected cells as described with reference to FIGS. 7A–7B, 8A–8B and 9A–9C.

The program lines 201 are vertically separated from the word lines 202 by a layer of dielectric material. Examples of dielectric materials include silicon oxides, silicon nitrides and silicon oxynitrides. Furthermore, the dielectric materials may include doped silicon oxides, such as borophosphosilicate glass (BPSG). The bit lines 209 are vertically separated from the word lines 202 and program lines 201 by a further layer of dielectric material. Word lines 202 form the gates of the memory cells (not shown in FIG. 2). Program line contacts (PLCT) 211 are coupled to first source/drain regions of the memory cells while bit line contacts (BLCT) 219 are coupled to second source/drain regions of the memory cells.

FIGS. 3A–3D show a cross-section of the embodiment of FIG. 2 taken along dotted line A–A' at various stages of fabrication. It will be appreciated that the program lines 201 and bit lines 209 run parallel to the section taken, with only their contact structures 211 and 219 being seen in FIGS. 3A–3D, while word lines 202 extend normal to the cross-section. Thus, the word lines 202 are orthogonal to the program lines 201 and bit lines 209.

The gate dielectric layer 203 is formed overlying a semiconductor region having a conductivity type, such as an n-well 102 formed in a p-type substrate 101. Formation of the n-well 102 includes formation of the source/drain regions and channel regions of the memory cell transistors. Note that since the transistors are depletion-mode devices, the doping level of the n-well 102 will be such that the channel region can be depleted by one of the two states of the later-deposited ferroelectric layer. For one embodiment, the substrate 101 is doped with an n-type impurity, such as phosphorus, to a doping level of approximately $1.0\mathrm{E}18\ \mathrm{cm}^{-3}$ and to a depth of approximately 800 Å, thereby forming the n-well 102. For additional embodiments, the substrate 101 is doped with an n-type impurity ranging from a doping level of approximately $4.0\mathrm{E}18\ \mathrm{cm}^{-3}$ at a depth of approximately 300 Å to a doping level of approximately $1.0\mathrm{E}17\ \mathrm{cm}^{-3}$ at a depth of approximately 1200 Å. For yet another embodiment, the doping level of the source/drain regions of a transistor is the same as the doping level of the channel region of the transistor.

The gate dielectric layer 203 is a non-ferroelectric dielectric material, such as a silicon oxide. The silicon oxide may be formed by conventional methods, such as thermal oxidation. As an example, the substrate 101 may be placed in an oxygen-containing ambient at approximately 900° C. to grow the gate dielectric layer 203. Other methods of forming the gate dielectric layer 203 include physical vapor deposition (PVD) and chemical vapor deposition (CVD) as is known in the art of integrated circuit fabrication. For another embodiment, the gate dielectric layer 203 is silicon nitride formed by a PVD process, such as jet vapor deposition. Other dielectric materials may be used for the gate dielectric layer 203. Specific examples include silicon oxides, silicon nitrides and silicon oxynitrides.

The floating gate 204 contains a conductive material, such as conductively-doped polysilicon, metal silicide, metal or metal alloy. Polysilicon layers are generally formed by CVD. Metal silicide layers may be formed directly through CVD, or they may be formed sequentially, such as by depositing a layer of metal on a silicon-rich layer, and reacting the layer of metal with the underlying silicon-rich layer. Metals and metal alloys are generally formed by a PVD process, such as sputtering.

The floating gate 204 will generally have the gate dielectric layer 203 on one side and the FE layer 206 on the other side. As such, the floating gate 204 may require multiple layers to provide adhesion to adjoining layers and/or to provide barrier properties for the ferroelectric material. For one embodiment, the floating gate 204 contains a metal layer overlying a conductively-doped polysilicon layer. For a further embodiment, the metal layer contains more than one metal layer, such as a layer of platinum overlying a layer of titanium. For another embodiment, the metal layer contains a layer of iridium overlying a layer of iridium oxide ($IrO_2$).

The FE layer 206 is formed overlying the floating gate 204. For one embodiment, the FE layer 206 is a metal oxide, such as strontium bismuth tantalite (SBT) or lead zirconium titanate (PZT). Other metal oxides having ferroelectric properties may be used for the FE layer 206. Some examples include lanthanum-doped PZT (PLZT), lithium niobate ($LiNbO_3$), or additional metal oxides having a perovskite crystalline structure. The metal oxide may be formed by such CVD techniques as metal organic decomposition. For one embodiment, the floating gate 204 is eliminated for cases where the gate dielectric layer 203 is compatible with the FE layer 206, such that the FE layer 206 is overlying and adjoining the gate dielectric layer 203. For a further embodiment, the gate dielectric layer 203 and the floating gate 204 are eliminated where the semiconductor material, e.g., n-well 102, is compatible with the FE layer 206, such that the FE layer 206 is overlying and adjoining the semiconductor material.

A control gate 207 is formed overlying the FE layer 206. The control gate 207 contains a conductive material. For one embodiment, the control gate 207 includes a barrier layer, such as a metal barrier layer. For a further embodiment, the control gate 207 contains more than one layer. As one example, the control gate 207 may contain a layer of titanium overlying a layer of platinum. As another example, the control gate 207 may contain a metal layer overlying a conductive metal oxide layer, such as a layer of iridium overlying a layer of iridium oxide.

A cap layer 212 is generally formed overlying the control gate 207 to act as an insulator and barrier layer for the word line stack. The cap layer 212 contains an insulator and may include such insulators as silicon oxide, silicon nitride, and silicon oxynitrides. For one embodiment, the cap layer 212 is silicon nitride, formed by such methods as CVD or PVD.

Figure 3A:
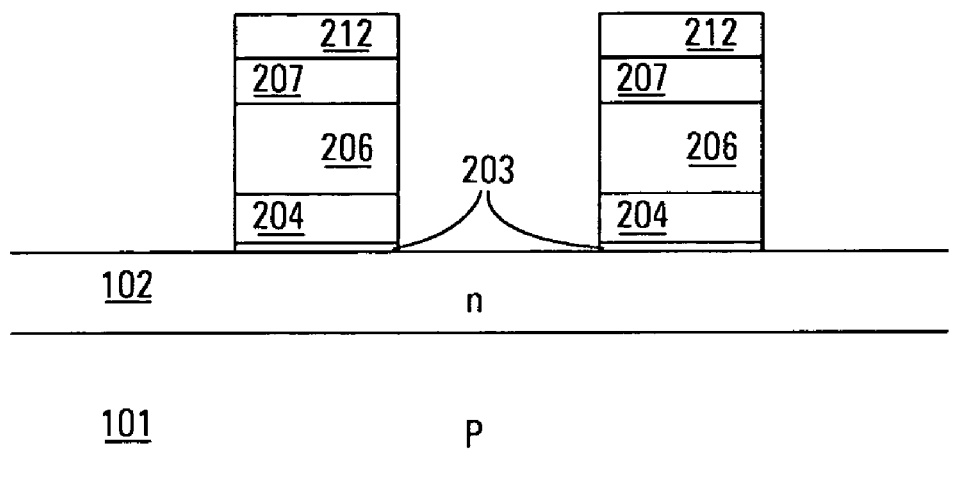
FIGS. 3A–3D are cross-sectional views of memory cells at various stages in their fabrication in accordance with one embodiment of the invention.

The gate dielectric layer 203, the floating gate 204, the FE layer 206, the control gate 207 and the cap layer 212 are subsequently patterned to define the word line stack as depicted in FIG. 3A. Patterning can include use of standard photolithographic techniques. As an example, a layer of photoresist may be deposited, exposed with an energy source, and developed to expose portions of the word line stack. Material is then removed from the exposed portions of the word line stack, including the exposed portions of the gate dielectric layer 203, the floating gate 204, the FE layer 206, the control gate 207 and the cap layer 212. Such removal may typically include chemical or ion etching. The resist is then removed, such as by plasma etch.

While the definition of the word line stack in the foregoing description is performed in a single patterning step, the layers may be individually patterned. For one embodiment, the gate dielectric layer 203 and the floating gate 204 are patterned prior to formation of the FE layer 206. The FE layer 206 is then patterned to have a width less than the width of the previous layers. Such a structure can provide additional diffusion barrier characteristics upon formation of the control gate 207; the control gate 207 can overlie both the surface and sidewalls of the FE layer 206.

Figure 3B:
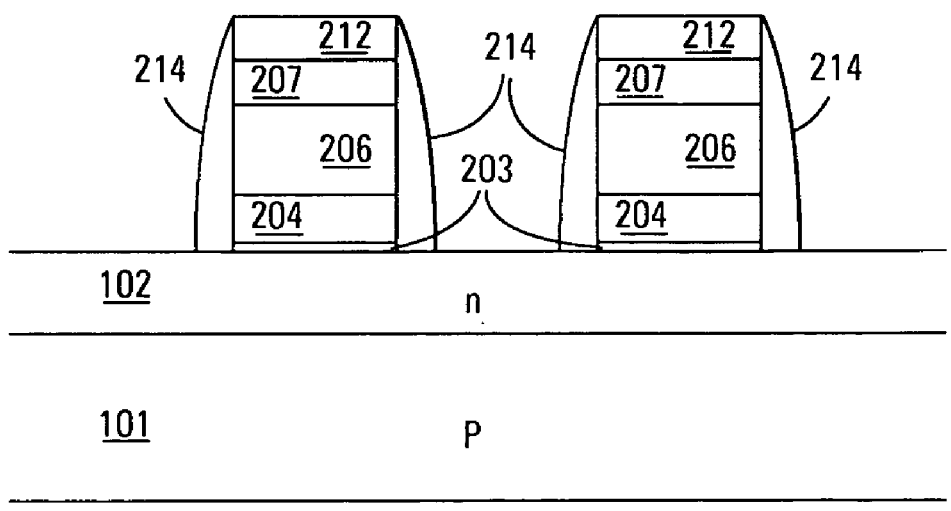

The sidewalls of the word lines 202 are then insulated using sidewall spacers 214. The sidewall spacers 214 contain an insulator and may include the same materials as the cap layer 212. The sidewall spacers 214 are typically formed by blanket depositing an insulating layer, such as a layer of silicon nitride, over the entire structure and then anisotropically etching the insulating layer to preferentially remove the horizontal regions and the leave only the vertical regions adjacent the sidewalls of the word line stacks. The resulting transistor is shown in FIG. 3B.

Figure 3C:
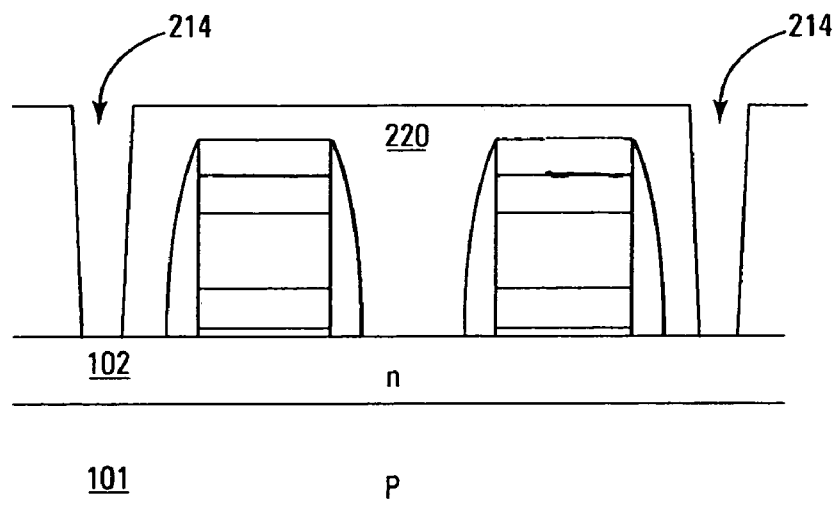

A bulk insulator layer 220 is formed overlying the word line stacks and patterned to define contact holes 214 for the program line contacts as shown in FIG. 3C. Conductive plugs 211 are formed in the contact holes 214 and the program lines 201 are formed overlying the plugs 211 and the bulk insulator layer 220 (outside the plane of the figure). Example plug structures include a conductively-doped polysilicon plug material with a metal silicide interface between the n-well 102 and the plug material. The plugs 211 are coupled to the program lines 201 using extensions to laterally offset the program lines 201 from their associated bit lines 209 in order to facilitate subsequent formation of the bit line contacts.

Figure 3D:
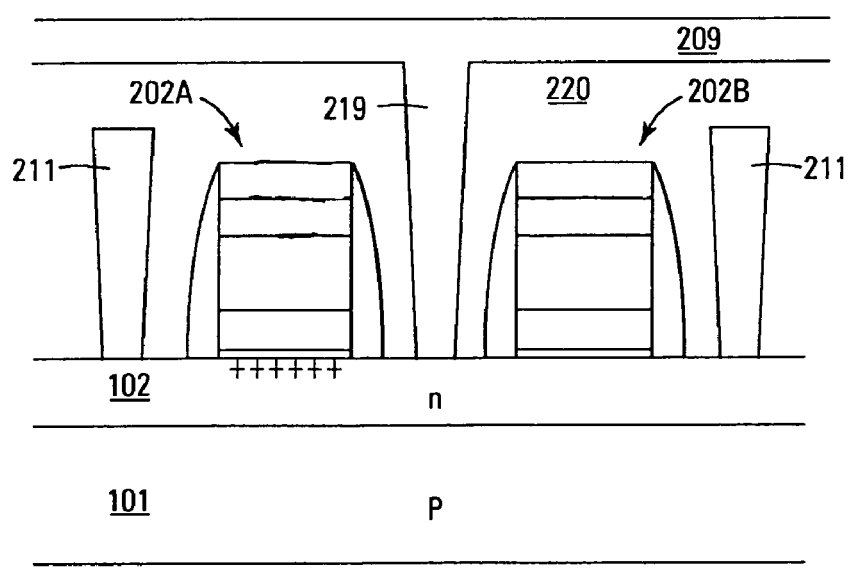

The bulk insulator layer 220 is extended in FIG. 3D and patterned to define contact holes for the bit line contacts. Conductive plugs 219 are formed in the contact holes and the bit lines 209 are formed overlying the plugs 219 and the extended bulk insulator layer 220 as depicted in FIG. 3D. The conductive plugs 211 and 219 provide electrical communication between the semiconductor material and the program lines 201 and bit lines 209, respectively.

The bit lines 209 and program lines 201 are coupled to columns of memory cells of a memory array. Each contains a conductive material. For one embodiment, the bit line 209 and/or program line 201 contains a metal. For another embodiment, the bit line 209 and/or program line 201 contains a metal alloy. For a further embodiment, the bit line 209 and/or program line 201 contains more than one layer of conductive material. The bit lines 209 and program lines 201 may make use of an insulative cap layer as with the word lines 202. The word lines 202 further contain a conductive material. The word lines 202 may double as the control gate 207 of the memory cell transistors and thus be coupled to and have the same construction as the control gate 207 described with reference to FIGS. 3A–3D. Alternatively, the cap layer 212 may be eliminated and the word lines 202 may be formed to overlie and couple to the control gates 207. The word lines 202 are coupled to rows of memory cells of the memory array.

Each transistor of each word line 202 can have a first programmed state representing a first data value, such as a data value of 1, or a second programmed state representing a second data value, such as a data value of 0. The programmed state is a function of the polarization of the FE layer 206. Word line 202A depicts an FE layer 206 programmed to the second programmed state. In the second programmed state, the additional negative voltage at the gate dielectric layer 203 causes a depletion layer to form underneath the gate, so that the transistor is deactivated at a zero gate/source voltage corresponding to an "off" state. Word line 202B depicts an FE layer 206 programmed to the first programmed state. In the first programmed state, the additional positive voltage at the gate dielectric layer 203 will attract electrons, such that the transistor is activated at a zero gate/source voltage corresponding to an "on" state.

Figure 4:
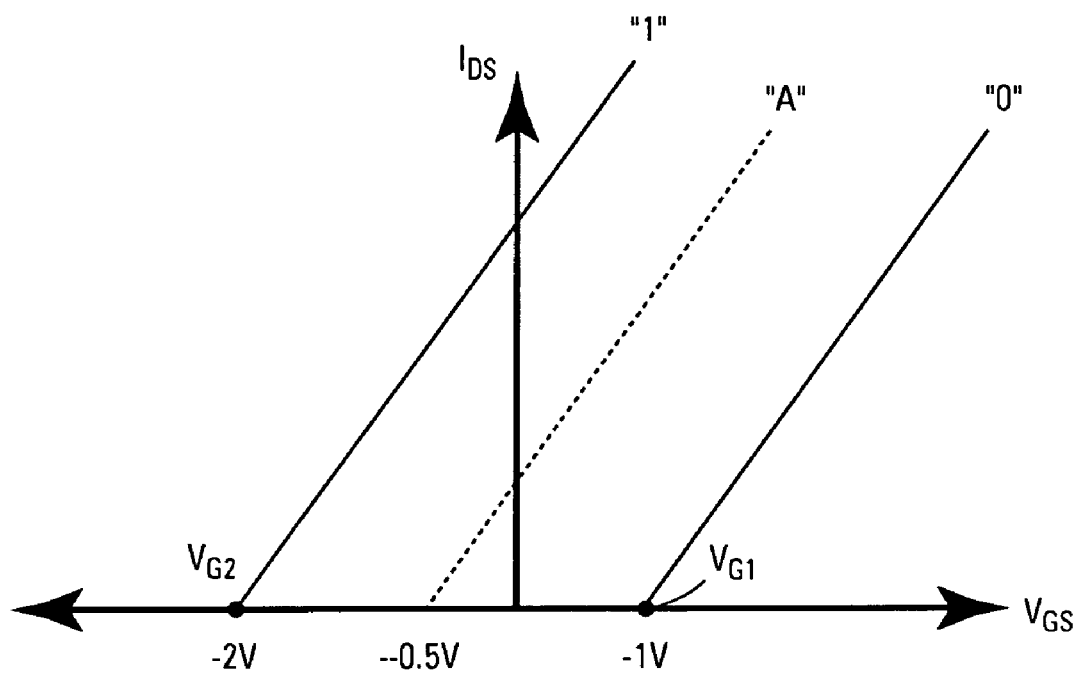
FIG. 4 is a diagram of current/voltage curves ($I_{DS}$ vs. $V_{GS}$) for two different polarization states of a transistor in accordance with the invention in relation to a comparable transistor without a ferroelectric layer.

FIG. 4 shows example current/voltage curves ($I_{DS}$ vs. $V_{GS}$) for the two different polarization states of one embodiment of the transistor. A ferroelectric transistor that is in the first programmed state will turn on at a lower gate/source voltage $V_{GS}$ (in this example, where $V_{GS}=V_{G2}=-2V$) relative to a comparable depletion-mode transistor without a ferroelectric layer, shown as "A" in FIG. 4. Likewise, a ferroelectric transistor that is in the second programmed state will turn on at a higher $V_{GS}$ (in this example, where $V_{GS}=V_{G1}=1V$). While specific potential levels were used in the example, FIG. 4 is provided for illustrative purposes to show that varying the polarization of the ferroelectric layer 206 will alter the threshold voltage of the transistor, thus determining whether the transistor will be activated or deactivated in response to a given $V_{GS}$. Accordingly, the invention is not limited to the specific values of $V_{GS}$.

Figure 5:
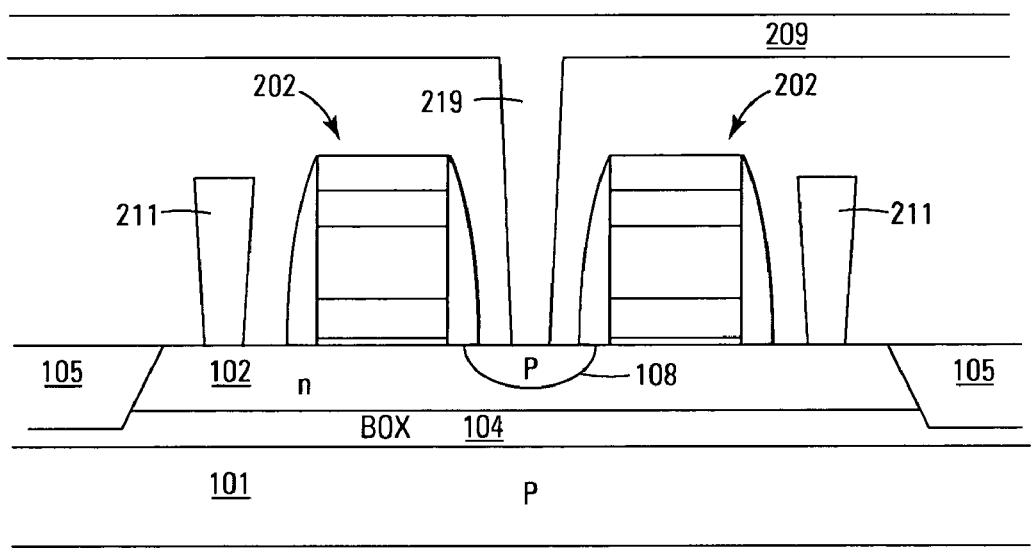
FIG. 5 is a cross-sectional view of memory cells in accordance with another embodiment of the invention.

In another embodiment, shown in FIG. 5, the disclosed array is seen formed on a silicon-on-insulator substrate. Complete isolation of the active areas from the underlying silicon substrate 101 is provided by a buried oxide (BOX) layer 104 or other layer of dielectric material, while shallow trench isolation (STI) areas 105 separate adjacent pairs of transistors. This cross-section is similar to the cross-section seen in FIG. 3, differing primarily in the area of device isolation. Formation of the buried oxide layer 104 and areas of shallow trench isolation 105 is well known in the art. Furthermore, formation of the memory cells can be accomplished as described with reference to FIG. 3. Accordingly, detailed discussion of fabrication techniques is omitted for clarity.

The embodiment of FIG. 5 shows further that a p-well 108 can be formed beneath the bit line contacts 219 to be interposed between the bit line 209 and a source/drain region of the transistor. The p-well 108 may be formed by doping an exposed portion of the n-well 102 with a p-type impurity, such as boron, after patterning the bulk insulator layer to define the contact hole for the bit line contact and before formation of the contact plug. Additionally, doping of the p-well 108 may occur prior to formation of the bulk insulator layer, using a separate mask. Such doping is usually performed through ion implantation techniques. However, other methods are known such as diffusion techniques using gaseous, liquid or solid dopant sources.

The pn junction between the n-well 102 and the p-well 108 forms a diode providing isolation between the source/drain region and the bit line during read/write biasing for added margin against read disturb. This diode configuration may also be used in the embodiment of FIGS. 3A–3D. However, the n-well 102 in FIGS. 3A–3D must be sufficiently deeper than the p-well 108 below the bit line contact 219 in order to avoid shorting of the p-well 108 to the underlying p-type substrate 101. The diodes of the various embodiments are isolated from the control gates 207 and, thus, the word lines 202.

Figure 6:
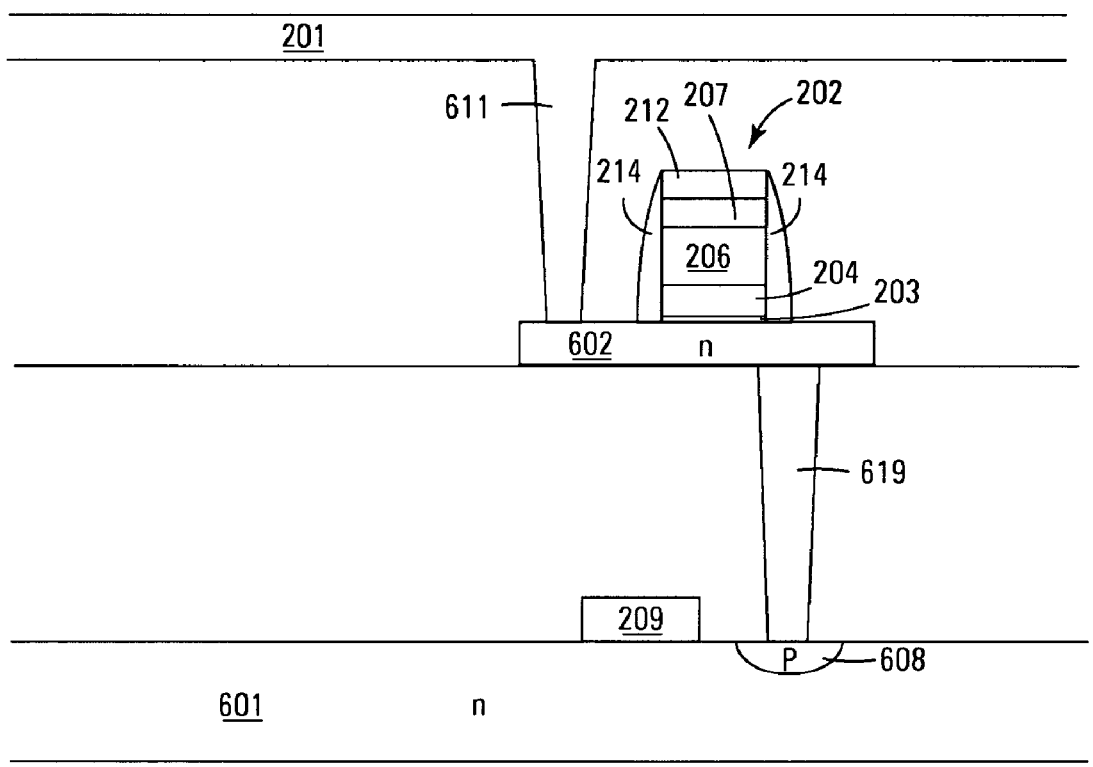
FIG. 6 is a cross-section view of a memory cell in accordance with a further embodiment of the invention.

In a further embodiment, the channel can be formed of polysilicon, rather than monocrystalline silicon. FIG. 6 is an example of a memory cell formed over polysilicon. In the embodiment shown in FIG. 6, the cells are formed so that they may overlie the sense amplifiers and row-column decode circuits (not shown in FIG. 6) formed on a substrate 601.

For the embodiment depicted in FIG. 6, the substrate 601 is an n-type substrate. The substrate 601 could further be a p-type substrate or a doped well of a first conductivity type, such as an n-well, formed in a doped substrate of a second and opposite conductivity type, such as a p-type substrate. Formation of the memory cell follows semiconductor fabrication techniques of the type described with reference to FIGS. 3A–3D, so details are omitted for clarity.

The memory cell includes a transistor as a portion of a word line 202. The transistor may have the same construction as that depicted in FIGS. 3A–3D, such as the gate dielectric layer 203, floating gate 204, FE layer 206, control gate 207, cap layer 212 and sidewall spacers 214. The word line 202 is formed overlying a conductively-doped polysilicon layer 602. The polysilicon layer 602 has a first conductivity type, such as an n-type conductivity. The first source/drain region of the transistor is coupled to a program line 201 through a conductive plug 611. The second source/drain region of the transistor is coupled to a bit line 209 through a conductive plug 619. A well 608 having the second conductivity type is formed in the substrate 601 interposed between the second source/drain region and the bit line 209, the substrate 601 having the first conductivity type. Thus, a diode is formed between the bit line 209 and a source/drain region of the memory cell transistor.

The word lines 202 and bit lines 209 run normal to the face of FIG. 6 for such an embodiment. Likewise, the program lines 201 for this embodiment run parallel to the face of FIG. 6.

An overview of the read and write operations will now be provided, with particular reference to the array architecture of FIGS. 2 and 3A–3D. It is assumed for the following examples that the voltage drop needed to change the state of the ferroelectric layer is approximately 2V. The gate/source voltage $V_{GS}$ generally can be broken down into two primary components, i.e., a voltage drop across the gate dielectric layer and a voltage drop across the ferroelectric layer. Determination of the voltage drop across each of these dielectric layers of the gate stack can be made using standard calculations for the voltage drop across a series capacitance.

The programming voltage $V_{pp}$ must be sufficient to produce a voltage drop across the ferroelectric layer that is equal to or greater than the remanent coercivity of the ferroelectric layer, i.e., an electric field sufficient to cause reversal of polarity of the ferroelectric layer. As noted above, this is assumed to be approximately 2V for the example embodiment. While the value of $V_{pp}$ will depend upon the chosen fabrication materials and transistor dimensions, as used in the examples herein $V_{pp}$ will be presumed to have a magnitude sufficient to cause reversal of polarity of the given ferroelectric layer when applied across the gate of the transistor. While it is generally preferred that $V_{pp}$ have the minimum magnitude necessary to cause reversal of polarity (while accounting for engineering margins), higher values can be used provided the resulting voltage drops across non-selected cells does not exceed the remanent coercivity of the ferroelectric layer of any such non-selected cell. For the example embodiments, $V_{pp}$ is approximately 6V.

Write Operation

Figure 7A:
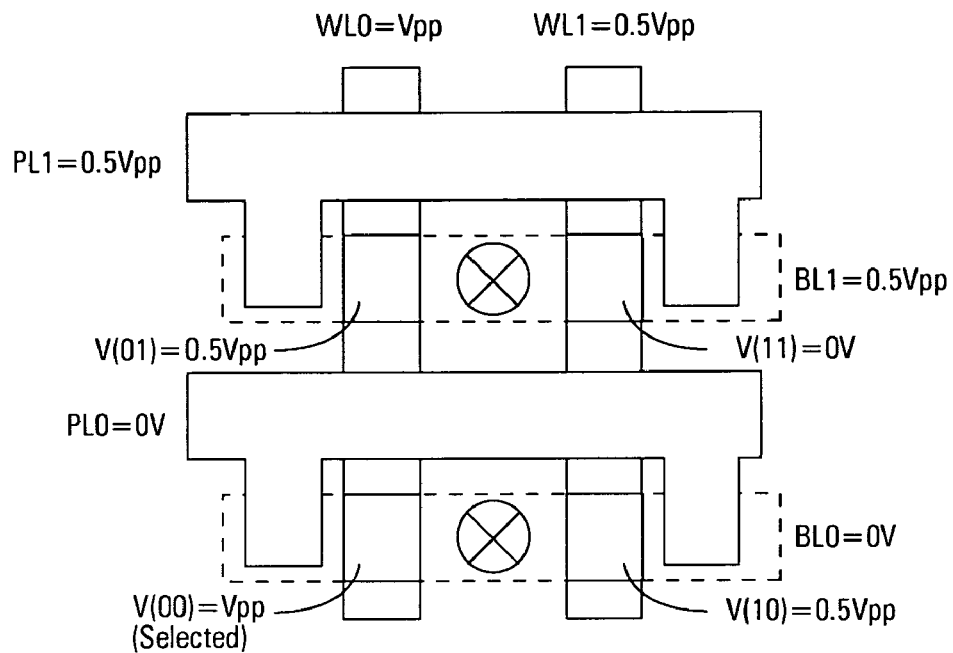
FIGS. 7A–7B are voltage diagrams of the array architecture of FIG. 2 during a write operation.
Figure 7B:
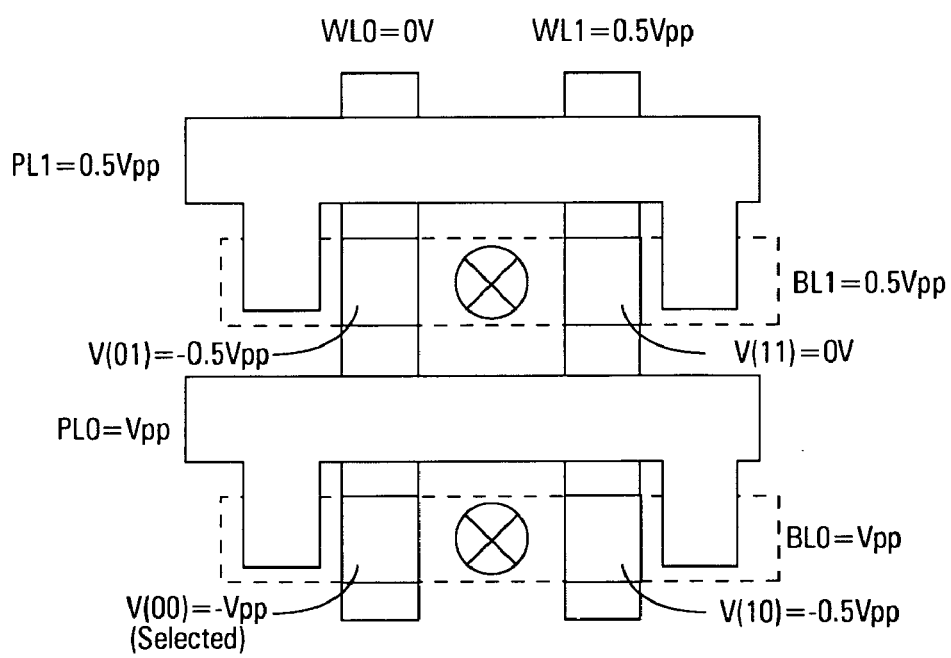

FIGS. 7A–7B show the voltages applied to the array for writing a first data value, e.g., a data value of 1, or a second data value, e.g., a data value of 0, respectively, to the cell located in the lower left-hand corner of each of the drawings and represented by the intersection of WL0 and BL0. In FIG. 7A, to write the first data value, the bit line, program line, and word line of all non-selected rows and columns (BL1, PL1, and WL1 in this drawing) are set to some fraction of $V_{pp}$ in order to avoid disturbing the polarity of the non-selected memory cells. For one embodiment, the bit line, program line, and word line of all non-selected rows and columns are set to approximately $V_{pp}/2$ (3V in this example). The selected bit line (BL0) and program line (PL0) are set to a ground potential, i.e., 0V. The selected word line (WL0) is set to $V_{pp}$ (6V in this example). By applying a voltage differential across the ferroelectric layer equal to or exceeding the programming voltage, the cell can be forced to a data value of 1. Furthermore, as seen in the figure, the change in voltage (ΔV) seen across the non-selected cells is either 0V (for a cell in which neither the row nor column was selected) or $V_{pp}/2$ (for a cell in which either the row or the column, but not both, was selected), neither of which is sufficient to reverse the cell's polarity. Thus, data values of the non-selected cells are not altered during the write operation of the selected cell.

In FIG. 7B, writing the second data value is shown. Non-selected rows and columns again have their bit lines, program lines, and word lines set to some fraction of $V_{pp}$, such as $V_{pp}/2$. In the selected column, the bit line and program line are set to $V_{pp}$, and in the selected row, the word line is set to 0V. Again, non-selected cells see a ΔV of 0V or of $-V_{pp}/2$, neither of which will change the state of these cells, but the selected cell will see a ΔV of $-V_{pp}$, which is sufficient to cause a cell having the first data value to reverse its polarity.

In write mode, the resulting matrix of voltages seen by the cells will therefore be as shown in Table 1 below (where two values are shown, the first is for writing the first data value and the second, in parenthesis, is for writing the second data value).

TABLE 1

| | First Source/Drain Region | Second Source/Drain Region | Gate | $V_{GS}$ |
|---|---|---|---|---|
| Selected Cell | 0 V ($V_{pp}$) | 0 V ($V_{pp}$) | $V_{pp}$ (0 V) | $V_{pp}$ ($-V_{pp}$) |
| Half-selected (same row) | $V_{pp}/2$ | $V_{pp}/2$ | $V_{pp}$ (0 V) | $V_{pp}/2$ ($-V_{pp}/2$) |
| Half-selected (same column) | 0 V ($V_{pp}$) | 0 V ($V_{pp}$) | $V_{pp}/2$ | $V_{pp}/2$ ($-V_{pp}/2$) |
| Non-selected | $V_{pp}/2$ | $V_{pp}/2$ | $V_{pp}/2$ | 0 V |

Read Operation

Figure 8A:
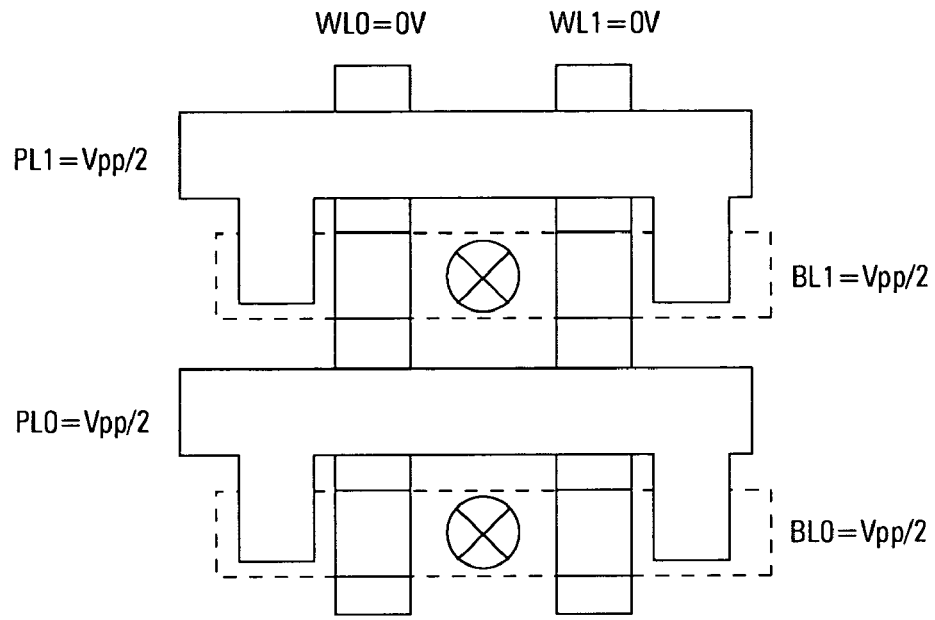
FIGS. 8A–8B are voltage diagrams of the array architecture of FIG. 2 during a read operation.
Figure 8B:
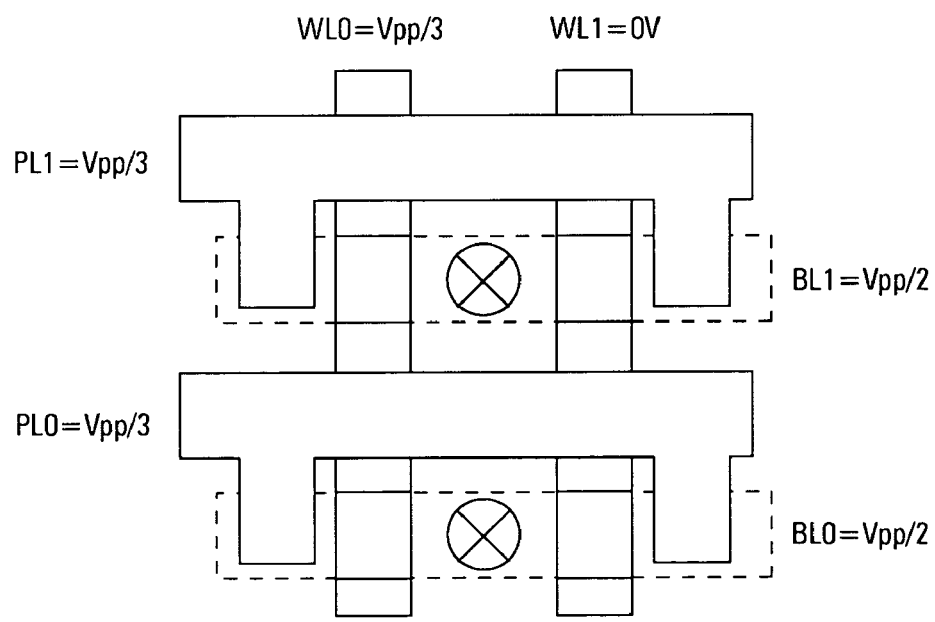
Figure 9A:
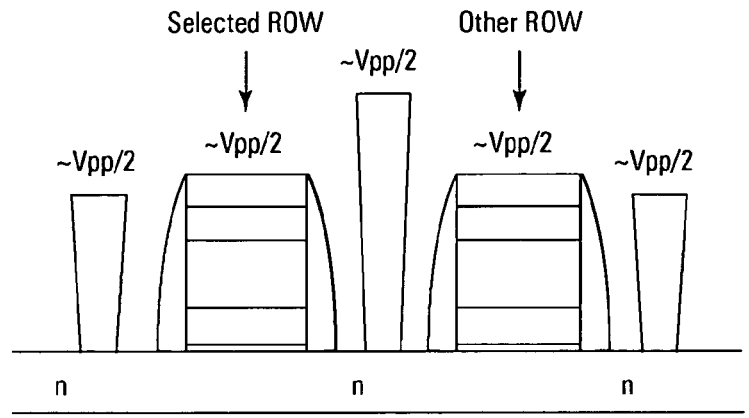
FIGS. 9A–9C are cross-sectional views of memory cells showing applied voltages and depletion/accumulation effect during various stages of a read operation.

FIGS. 8A–8B and 9A–9C demonstrate an example of the READ operation of the cell. FIG. 9A shows a cross-section of two cells, giving the voltages at which they are normally held in stand-by mode; in this case, approximately $V_{pp}/2$ (3V in this example) on all lines. Before the read operation, the word line voltages are dropped to the ground potential, as shown in FIG. 8A, from this stand-by mode. In this example, the resulting effective gate/source voltage $V_{GS}$ on every cell is thus approximately −2V. As the curves of FIG.

Figure 9B:
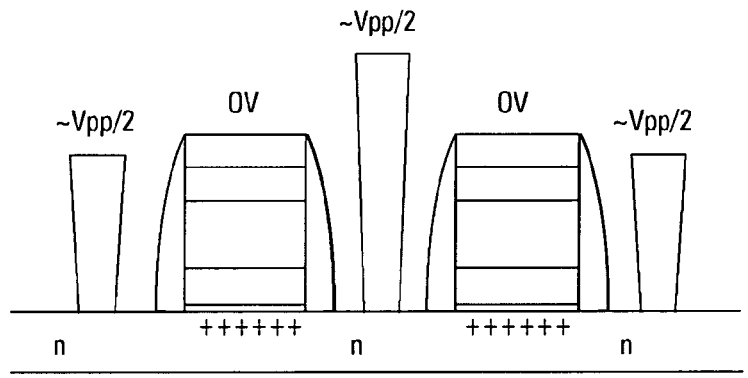

4 show, no cells are able to turn on at this $V_{GS}$, so all cells are shut off. FIG. 9B shows a cross-section of two cells during this initialization phase, demonstrating the depletion region that is formed under these conditions.

In the read phase, shown in FIG. 8B, the selected word line WL0 is brought up to approximately $V_{pp}/3$ or approximately 2V. Concurrently, each program line voltage is dropped to approximately $V_{pp}/3$ or approximately 2V. This means that $V_{GS}$ for the selected cells is now approximately −0.5V. As FIG. 4 shows, cells programmed to a first programmed state are able to conduct at this voltage, but cells programmed to the second programmed state are not. Conduction in this example will be from the selected bit line to its corresponding program line as the program line is at a smaller fraction of the programming voltage than the bit line. Suitable sensing architectures will detect a current drain, and thus a voltage drop, on the selected bit line. For sensing architectures adapted to detect an incoming current to the bit line, and thus a voltage rise on the selected bit line, voltages of the bit lines and program lines would correspondingly be swapped.

Figure 9C:
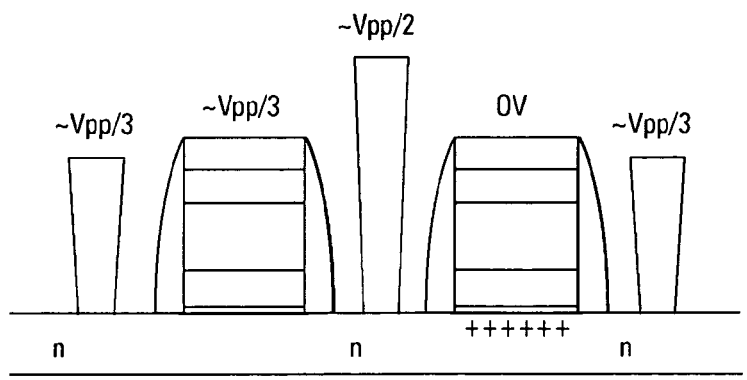

During the read phase, the $V_{GS}$ of the non-selected cells remains below their turn-on point, while the $V_{GS}$ of the selected cell is sufficient to cause activation of the transistor if it is in the first programmed state and insufficient to cause activation of the transistor if it is in the second programmed state. FIG. 9C shows a cross-section of the same two cells, where the left-hand cell is being read and is programmed to the first programmed state. This transistor will turn on and pull its respective bit line down. Conventional sensing architectures and methods can be used to sense the conducting state of the selected cells.

Devices and Systems

Figure 10:
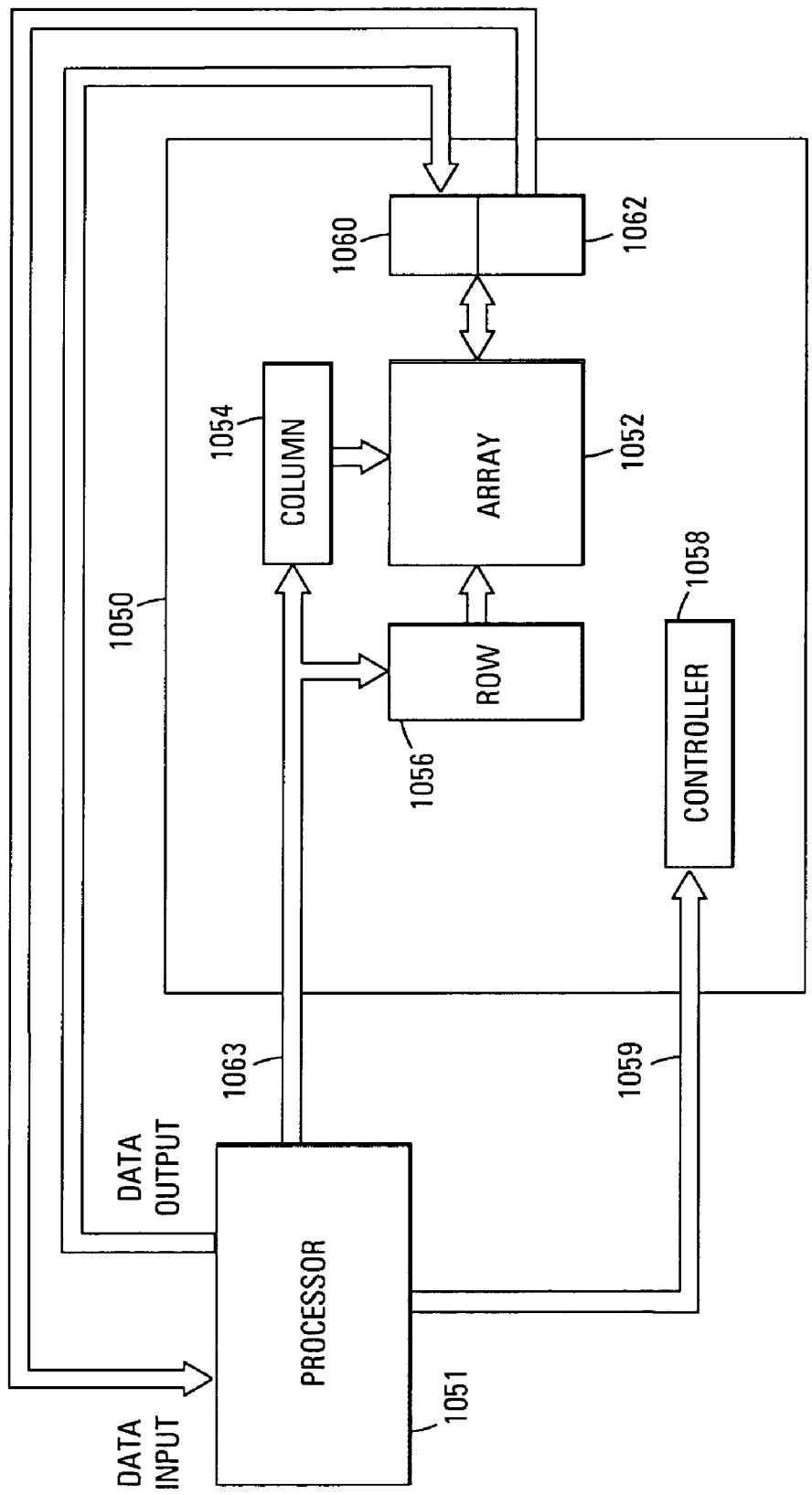
FIG. 10 is a block diagram of a memory device in accordance with an embodiment of the invention.

FIG. 10 shows a general block diagram of a memory device 1050 incorporating ferroelectric floating-gate memory cells and array architectures in accordance with the various embodiments of the invention. The ferroelectric memory device 1050 is coupled to a processor 1051 to form an electronic system. The memory device includes a memory array 1052, column decoder 1054 and row decoder 1056, and a control circuit 1058. The memory array 1052 contains memory cells arranged in rows and columns. The memory array 1052 contains the ferroelectric floating-gate memory cells and/or array architectures in accordance with the various embodiments of the invention.

The memory device 1050 further includes input 1060 and output 1062 buffers connected to data input and data output lines, respectively. The data input and output lines can be multiplexed together, but have been illustrated separately for simplicity. Address lines 1063 are provided as input to the column decoder 1054 and row decoder 1056 to address a portion of the memory array 1052.

In operation, the memory device control circuit 1058 responds to control inputs 1059 from the processor 1051 to control operations performed on the memory array 1052. In particular, the control circuit 1058 is used to read data from and write data to the memory array 1052. During one of these access operations, an address provided on the address lines 1063 is decoded by the row decoder 1056 to activate a word line, thereby accessing a row of the memory array 1052. Likewise, an address provided on the address lines 1063 is decoded by the column decoder 1054 to activate at least one bit line, thereby accessing at least one column of the memory array 1052. An addressed memory cell is located at the intersection between each activated word line and each activated bit line. During a read operation, the data stored in the addressed memory cell(s) is then transferred to the output buffer 1062 and provided on the data output lines. In a write operation, the addressed memory cell is accessed and data provided on the data input lines is stored in the cell.

CONCLUSION

Depletion-mode ferroelectric transistors have been described for use as non-volatile memory cells. Such memory cells find use in non-volatile memory devices as well as other electronic systems having non-volatile memory storage. Various embodiments are described having a diode interposed between the bit line and a source/drain region of the transistor for added margin against read disturb. Various additional embodiments are described having an array architecture such that two memory cells sharing the same bit line also share the same program line. Using this configuration, non-selected cells are readily supplied with gate/source voltages sufficient to maintain the cells in a deactivated state during read and write operations on selected cells.

While specific dimensions were referred to in the example embodiments, the invention is not limited to the specific dimensions provided. It is recognized that there is a continuing drive to reduce device dimensions in integrated circuit manufacture. Accordingly, the referenced dimensions are intended only as guidelines under current manufacturing practices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
an array of memory cells, wherein each memory cell comprises:
a ferroelectric layer formed overlying a first well region having a first conductivity type, wherein the first well region is formed in a substrate having a second conductivity type opposite the first conductivity type;
a control gate formed overlying the ferroelectric layer;
a first source/drain region having the first conductivity type formed in the first well region;
a second source/drain region having the first conductivity type formed in the first well region;
a channel region having the first conductivity type formed in the first well region and interposed between the first and second source/drain regions; and
a second well region having the second conductivity type formed in the first well region and coupled to the second source/drain region, wherein the second well region is isolated from the control gate;
a plurality of word lines coupled to rows of memory cells of the array of memory cells through their control gates;
a plurality of program lines coupled to columns of memory cells of the array of memory cells through their first source/drain regions;

a plurality of bit lines coupled to columns of memory cells of the array of memory cells through their second well regions;

a row decoder coupled to the array of memory cells; and a column decoder coupled to the array of memory cells.

2. The memory device of claim 1, wherein each memory cell further comprises:

a gate dielectric layer interposed between the channel region and the ferroelectric layer; and a floating gate interposed between the gate dielectric layer and the ferroelectric layer.

3. The memory device of claim 2, wherein each of the floating gates comprises a conductive material.

4. The memory device of claim 3, wherein the conductive material includes at least one material selected from the group consisting of conductively-doped polysilicon, metal silicides, metals and metal alloys.

5. The memory device of claim 4, wherein each of the floating gates comprises a metal layer overlying a conductively-doped polysilicon layer.

6. The memory device of claim 1, wherein the ferro electric layer of each memory cell comprises a material selected from the group consisting of strontium bismuth tantalite, lead zirconium titanate, lanthanum-doped lead zirconium titanate, lithium niobate and metal oxides having a perovskite crystalline structure.

7. The memory device of claim 1, wherein each memory cell further comprises: a gate dielectric layer interposed between the channel region and the ferroelectric layer; wherein the ferroelectric layer is overlying and adjoining the gate dielectric layer.

8. The memory device of claim 1, wherein the ferroelectric layer of each memory cell is overlying and adjoining its channel region.

9. The memory device of claim 1, wherein each second well region is interposed between its associated second source/drain region and a bit line coupled to its associated memory cell.

10. A memory device, comprising:

an array of memory cells, wherein each memory cell comprises:

a ferroelectric layer formed overlying a first well region having a first conductivity type, wherein the first well region is formed in a substrate having a second conductivity type opposite the first conductivity type and wherein the ferroelectric layer of each memory cell comprises a material selected from the group consisting of strontium bismuth tantalite, lead zirconium titanate, lanthanum-doped lead zirconium titanate, lithium niobate and metal oxides having a perovskite crystalline structure;

a control gate formed overlying the ferroelectric layer;

a first source/drain region having the first conductivity type formed in the first well region;

a second source/drain region having the first conductivity type formed in the first well region;

a channel region having the first conductivity type formed in the first well region and interposed between the first and second source/drain regions;

a gate dielectric layer interposed between the channel region and the ferroelectric layer;

a conductive floating gate interposed between the gate dielectric layer and the ferroelectric layer; and a second well region having the second conductivity type formed in the first well region and coupled to the second source/drain region, wherein the second well region is isolated from the control gate;

a plurality of word lines coupled to rows of memory cells of the array of memory cells through their control gates;

a plurality of program lines coupled to columns of memory cells of the array of memory cells through their first source/drain regions;

a plurality of bit lines coupled to columns of memory cells of the array of memory cells through their second well regions;

a row decoder coupled to the array of memory cells; and a column decoder coupled to the array of memory cells.

11. The memory device of claim 10, wherein each of the floating gates comprises a metal layer overlying a conductively-doped polysilicon layer.

12. A memory device, comprising:

an array of memory cells, wherein each memory cell comprises:

a ferroelectric layer formed overlying a first well region having a first conductivity type, wherein the first well region is formed in a substrate having a second conductivity type opposite the first conductivity type and wherein the ferroelectric layer of each memory cell comprises a material selected from the group consisting of strontium bismuth tantalite, lead zirconium titanate, lanthanum-doped lead zirconium titanate, lithium niobate and metal oxides having a perovskite crystalline structure;

a control gate formed overlying the ferroelectric layer;

a first source/drain region having the first conductivity type formed in the first well region;

a second source/drain region having the first conductivity type formed in the first well region;

a channel region having the first conductivity type formed in the first well region and interposed between the first and second source/drain regions;

a gate dielectric layer interposed between the channel region and the ferroelectric layer, wherein the ferro electric layer is overlying and adjoining the gate dielectric layer; and a second well region having the second conductivity type formed in the first well region and coupled to the second source/drain region, wherein the second well region is isolated from the control gate;

a plurality of word lines coupled to rows of memory cells of the array of memory cells through their control gates;

a plurality of program lines coupled to columns of memory cells of the array of memory cells through their first source/drain regions;

a plurality of bit lines coupled to columns of memory cells of the array of memory cells through their second well regions;

a row decoder coupled to the array of memory cells; and a column decoder coupled to the array of memory cells.

13. A memory device, comprising:

an array of memory cells, wherein each memory cell comprises:

a ferroelectric layer formed overlying a first well region having a first conductivity type, wherein the first well region is formed in a substrate having a second conductivity type opposite the first conductivity type and wherein the ferroelectric layer of each memory cell comprises a material selected from the group consisting of strontium bismuth tantalite, lead zirconium titanate, lanthanum-doped lead zirconium titanate, lithium niobate and metal oxides having a perovskite crystalline structure;

a control gate formed overlying the ferroelectric layer;
a first source/drain region having the first conductivity type formed in the first well region;
a second source/drain region having the first conductivity type formed in the first well region;
a channel region having the first conductivity type formed in the first well region and interposed between the first and second source/drain regions, wherein the ferroelectric layer is overlying and adjoining the channel region; and
a second well region having the second conductivity type formed in the first well region and coupled to the second source/drain region, wherein the second well region is isolated from the control gate;
a plurality of word lines coupled to rows of memory cells of the array of memory cells through their control gates;
a plurality of program lines coupled to columns of memory cells of the array of memory cells through their first source/drain regions;
a plurality of bit lines coupled to columns of memory cells of the array of memory cells through their second well regions;
a row decoder coupled to the array of memory cells; and
a column decoder coupled to the array of memory cells.

14. An electronic system, comprising:
a processor; and
a memory device coupled to the processor, wherein the memory device comprises:
  an array of memory cells, wherein each memory cell comprises:
    a ferroelectric layer formed overlying a first well region having a first conductivity type, wherein the first well region is formed in a substrate having a second conductivity type opposite the first conductivity type;
    a control gate formed overlying the ferroelectric layer;
    a first source/drain region having the first conductivity type formed in the first well region;
    a second source/drain region having the first conductivity type formed in the first well region;
    a channel region having the first conductivity type formed in the first well region and interposed between the first and second source/drain regions; and
    a second well region having the second conductivity type formed in the first well region and coupled to the second source/drain region, wherein the second well region is isolated from the control gate;
  a plurality of word lines coupled to rows of memory cells of the array of memory cells through their control gates;
  a plurality of program lines coupled to columns of memory cells of the array of memory cells through their first source/drain regions;
  a plurality of bit lines coupled to columns of memory cells of the array of memory cells through their second well regions;
  a row decoder coupled to the array of memory cells; and
  a column decoder coupled to the array of memory cells.

15. The electronic system of claim 14, wherein each memory cell further comprises:
  a gate dielectric layer interposed between the channel region and the ferroelectric layer; and
  a floating gate interposed between the gate dielectric layer and the ferroelectric layer.

16. The electronic system of claim 15, wherein the floating gate of each memory cell comprises a conductive material.

17. The electronic system of claim 16, wherein the conductive material includes at least one material selected from the group consisting of conductively-doped polysilicon, metal silicides, metals and metal alloys.

18. The electronic system of claim 17, wherein the floating gate of each memory cell comprises a metal layer overlying a conductively-doped polysilicon layer.

19. The electronic system of claim 14, wherein the ferroelectric layer of each memory cell comprises a material selected from the group consisting of strontium bismuth tantalite, lead zirconium titanate, lanthanum-doped lead zirconium titanate, lithium niobate and metal oxides having a perovskite crystalline structure.

20. The electronic system of claim 14, wherein each memory cell further comprises:
  a gate dielectric layer interposed between the channel region and the ferroelectric layer;
  wherein the ferroelectric layer is overlying and adjoining the gate dielectric layer.

21. The electronic system of claim 14, wherein the ferroelectric layer of each memory cell is overlying and adjoining its channel region.

* * * * *